United States Patent [19]
Kajita

[11] Patent Number: 5,459,081
[45] Date of Patent: Oct. 17, 1995

[54] PROCESS FOR TRANSFERRING A DEVICE TO A SUBSTRATE BY VIEWING A REGISTRATION PATTERN

[75] Inventor: Mikihiro Kajita, Tokyo, Japan

[73] Assignee: NEC Corporation, Japan

[21] Appl. No.: 357,935

[22] Filed: Dec. 16, 1994

[30] Foreign Application Priority Data

Dec. 21, 1993 [JP] Japan .................................. 5-322522
Dec. 28, 1993 [JP] Japan .................................. 5-337172

[51] Int. Cl.⁶ .......................... H01L 31/18; H01L 21/66; H01L 21/58
[52] U.S. Cl. .................. 437/3; 437/8; 437/906; 437/974
[58] Field of Search .............................. 437/3, 906, 974, 437/8; 257/797; 29/25.1 WB

[56] References Cited

U.S. PATENT DOCUMENTS

| | | | |
|---|---|---|---|
| 3,762,040 | 10/1973 | Burns et al. | 29/593 |
| 4,742,431 | 5/1988 | Igarashi | 361/398 |
| 4,819,041 | 4/1989 | Redmond | 357/80 |
| 5,034,802 | 7/1991 | Liebes, Jr. et al. | 357/74 |
| 5,285,350 | 2/1994 | Villaume | 361/690 |

FOREIGN PATENT DOCUMENTS 3-287321  12/1991  Japan .

OTHER PUBLICATIONS

"Pixels Consisting of a Single Vertical–Cavity Laser Thyristor and a Double Vertical–Cavity Phototransistor", Kosaka et al., IEEE Photonics Technology Letters, vol. 5, No. 12, Dec. 1993, pp. 1409–1411.
"Monolithic Integration of GaAs and $In_{0.2}Ga_{0.8}As$ lasers by molecular beam epitaxy on GaAs", Appl. Phys. Lett. 58 (23), 10 Jun. 1991, pp. 2698–2700.

Primary Examiner—Olik Chaudhuri
Assistant Examiner—David E. Graybill
Attorney, Agent, or Firm—Laff, Whitesel, Conte & Saret, Ltd.

[57] ABSTRACT

In a device fabrication method, there are prepared a first substrate having registration patterns formed thereon and a second substrate having through bores formed therein and devices formed thereon through a separation layer. The two substrates are overlapped by viewing the registration patterns through the through bores. After the first substrate and the devices formed on the second substrate have been bonded, the devices are separated from the second substrate by selectively etching the separation layer, and are transferred to the first substrate.

9 Claims, 5 Drawing Sheets

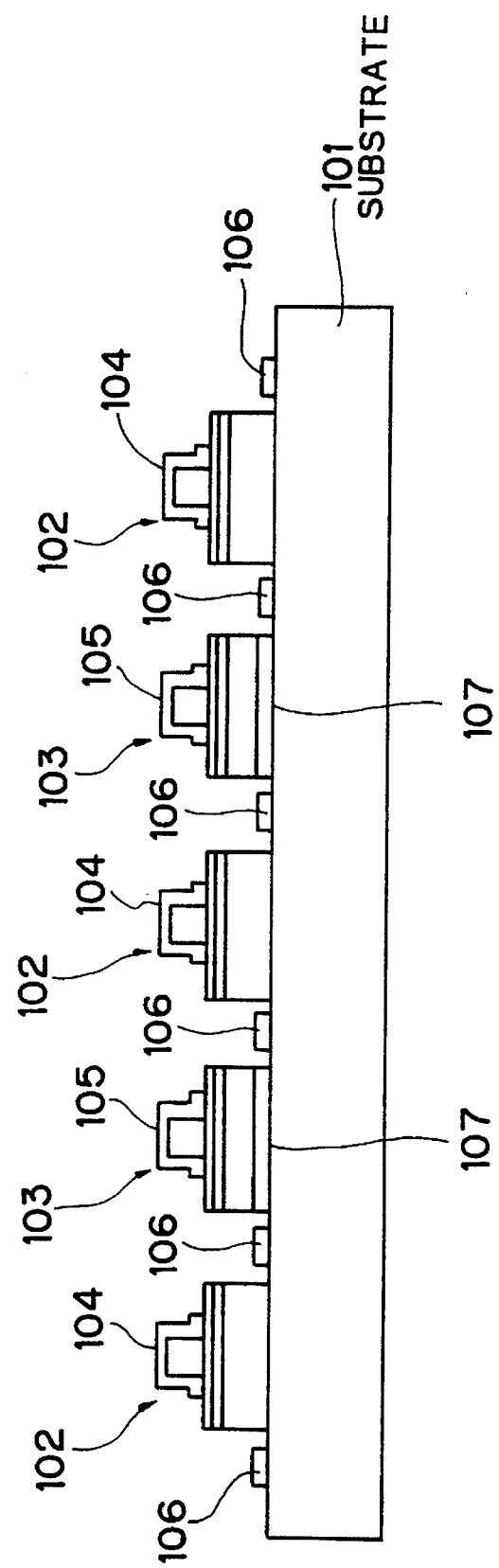

PROCESS FOR TRANSFERRING A DEVICE TO A SUBSTRATE BY VIEWING A REGISTRATION PATTERN

BACKGROUND OF THE INVENTION

1. Field of the Invention

The present invention relates to a method of forming devices on a substrate, and more particularly, to a method of forming semiconductor devices of different types on the same substrate.

2. Description of the Related Art

In recent years, optoelectronic integrated circuits are becoming increasingly the center of interest. Monolithic integration of optical devices using gallium arsenide (GAAS) or indium phosphide (InP) and electronic devices using silicon (Si) or GaAs has been expected to cause new functions to be realize and its operation speed to be dramatically increased. Particularly, optical devices are preferably formed two-dimensionally on a substrate to apply the parallel property and spatial propagation property inherent in light to information processing. The Study of such surface emitting devices is disclosed in the "Surface Emitting Semiconductor Lasers" (IEEE Journal of Quantum Electronics, Vol. 24, No.9, pp 1844–1855, September 1988).

However, in order to realize such optoelectronic devices, there are many technical difficulties. When light-emitting elements, light-receiving elements, optical modulators and the like are formed on the same semiconductor wafer, it is difficult to construct all of them suitably by a single growth method and process. In addition, repeating a regrowth process many times is practically impossible for reasons of interface processing.

Then, there has been extensively studied a technique in which materials different in lattice constant, such as Si, GaAs, and InP, are directly grown. Such a technique is disclosed, for example, in the "Growth of GaAs on Si by MOCVD" (Journal of Crystal of Growth, pp 21–26, 68 (1984)). However, since there is the problem that dislocation resulting from a lattice mismatch or a difference in coefficients of thermal expansion is introduced into such a grown film, it is necessary to insert a thick buffer layer.

An effective method for realizing an optoelectronic integrated circuit is to directly bond substrates different in lattice constant. This basic substrate bonding technique is disclosed in the "Si Wafer Direct-Bonding Technique" written by Furukawa at al. (Applied Physics, Vol. 60, No. 8, pp 790–793, 1991). A device manufacturing method using this substrate bonding technique is as follows. Devices are formed on a substrate through a separation layer using an ordinary growth method. The substrate is directly bonded to the other substrate with the devices intervening between them. And then the substrate is separated from the other substrate by selectively etching the separation layer to transfer the devices to the other substrate. Since in this method the number of processes is relatively small and the requirements for the interface are relatively less severe, it becomes possible to bond together respective devices formed optimally on individual substrates or to transfer by means of direct-bonding devices formed optimally on a substrate to another substrate on which an integrated circuit has already been formed. The substrate bonding technique, therefore, has been considered as an effective method for realizing an optoelectronic integrated circuit.

When a device is transferred from one substrate to another substrate by a device manufacturing method such as this, it is important to vertically align the two substrates accurately and determine a position to which the devices are to be transferred. As such a registration method, there has been proposed a method in which registration patterns are checked by means of infrared rays, or a position measuring method in which marks are formed on a substrate and a transparent substrate, respectively, and an image processing technique is employed (Japanese Patent Laid-open Publication No. HEI 3-287321).

The conventional device forming methods, however, have the following disadvantages. First, the registration process becomes complicated and costly when opaque substrates are bonded together since equipments such as an image processing apparatus by means of infrared rays are needed. Secondly, after two substrates have been bonded, a process of removing separation layers by etching takes substantial time.

SUMMARY OF THE INVENTION

Accordingly, it is an important object of the present invention to provide a device forming method which is capable of easily registering substrates when they are bonded together.

Another important object of the present invention is to provide a device fabrication method which is capable of shortening the time needed for separating bonded substrates.

Still another important object of the present invention is to provide a method of forming different kinds of semiconductor devices on the same substrate with a simpler process.

A device fabrication method according to the present invention is the improvement of a method for forming devices on a substrate using a direct-bonding technique. First, there is prepared a first substrate on which registration patterns are formed. Also, there is prepared a second substrate in which through bores are formed corresponding to the registration patterns and on which devices are formed with a separation layer intervening between the devices and the second substrate. The first and second substrates are subsequently overlapped referring to the registration patterns through the through bores. In this state, the surface of the first substrate and the upper surface of the device are bonded together. The device is subsequently transferred from the second substrate to the first substrate by selectively removing the separation layer by etching. Since the through bore is formed in the second substrate, the time needed for etching is reduced. By repeating this procedure, a plurality of devices having a different lattice constant can be formed easily on the first substrate.

BRIEF DESCRIPTION OF THE DRAWINGS

The above and other objects and advantages will become apparent from the following detailed description when read in conjunction with the accompanying drawings wherein:

FIG. 3 is a cross sectional view showing an optoelectronic integrated circuit that is fabricated by a second embodiment of the present invention;

DETAILED DESCRIPTION OF THE PREFERRED EMBODIMENTS

Figure 1:
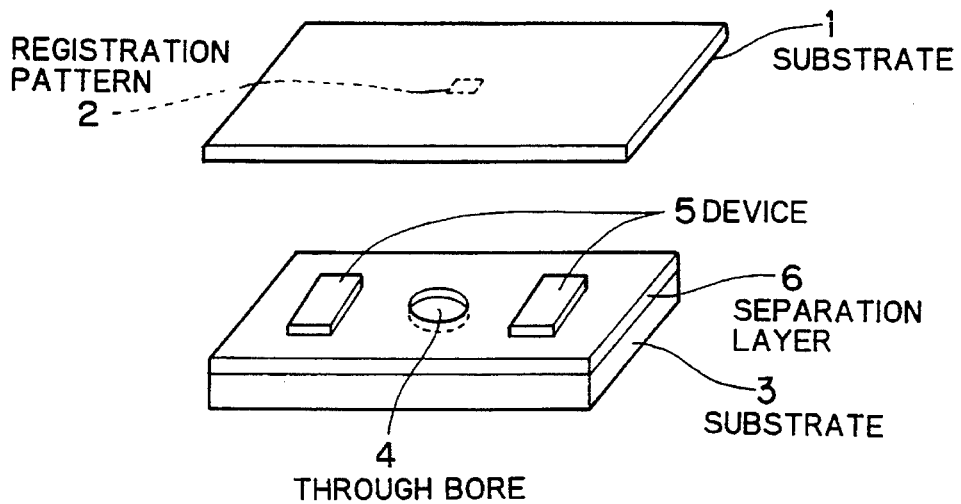
FIG. 1 is a perspective view showing substrates used in a first embodiment according to the present invention.

Referring now in greater detail to the drawings and initially to FIG. 1, reference numeral 1 denotes a first substrate on which devices are to be formed. A registration pattern 2 is formed on the first substrate 1 at a predetermined position thereof. A through bore 4 is formed in a second substrate 3 by cutting so that it can be vertically aligned (registered) with the registration pattern 2 of the first substrate 1. Optical devices 5 such as a semiconductor laser and a photodetector are formed through a separation layer 6 on the second substrate 3. In this embodiment, the first substrate I is comprised of silicon (Si), the second substrate 3 is comprised of indium phosphide (InP), the upper surface of the device 5 is comprised of Si, and the separation layer 6 is comprised of $In_xAl_{1-x}As$ (where from x=0 to 0.5) having a thickness of about 0.5 micron (um).

Figure 2A:
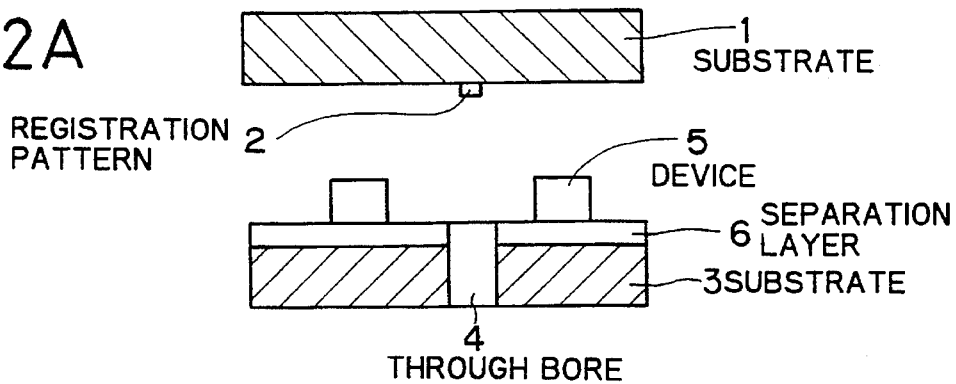
FIGS. 2A through 2C are diagrams showing the steps carried out by the first embodiment.
Figure 2B:
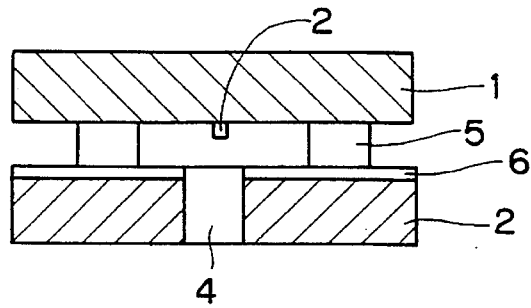

First, as shown in FIG. 2A, the Si substrate 1 and the InP substrate 3 are vertically registered with each other by viewing the registration pattern 2 through the through bore 4 of the InP substrate 3. Next, as shown in FIG. 2B, the Si substrate 1 and the InP substrate 3 are overlapped so that the upper surfaces of the devices 5 and the Si substrate 1 are contacted with each other. In this state, they are annealed in an ambient of $H_2$ at 600° C. for 60 min. As a result, the devices 5 and the first substrate 1 are bonded together.

Figure 2C:
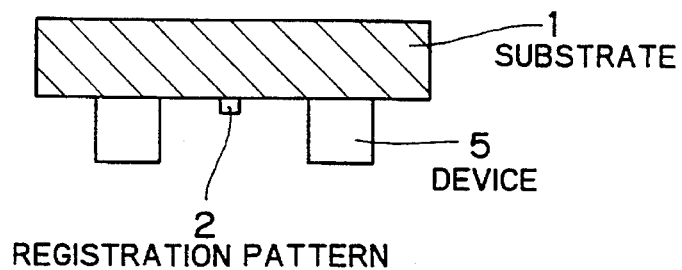

Subsequently, only separation layer 6 is selectively etched in an etchant of phosphoric acid. At this time, since the etchant goes into through the through bore 4, the time needed for etching and separating the separation layer 6 is shortened. In this way, the devices 5 are transferred from the second InP substrate 3 to the first Si substrate 1, as shown in FIG. 2C.

When it is desired that another device is further transferred, the device is formed on a third InP substrate and, in a similar procedure, the device can be transferred on the first Si substrate 1. By repeating the above-described processes, a desired integrated circuit can be formed on the Si substrate 1. Note that it is preferable that the substrate material be selected according to a device to be formed and also the materials of the separation layer and the etchant for removing it be suitably selected in a similar manner.

FIG. 3 schematically illustrates the construction of an optoelectronic integrated circuit fabricated by a second embodiment of the present invention. In this embodiment, a first surface emitting laser 102 of luminous wavelength 0.96 um and a second surface emitting laser 103 of luminous wavelength 0.98 um are formed on an n-GaAs substrate 101. The second surface emitting laser 103 is a device transferred from another substrate as described above, and is bonded through a bonding layer 107 to the substrate 101. An electrode 104 is formed on the upper surface of the first surface emitting laser 102, an electrode 105 is formed on the upper surface of the second surface emitting laser 103, and an electrode 106 is formed on the substrate 101 between the devices.

Figure 4:
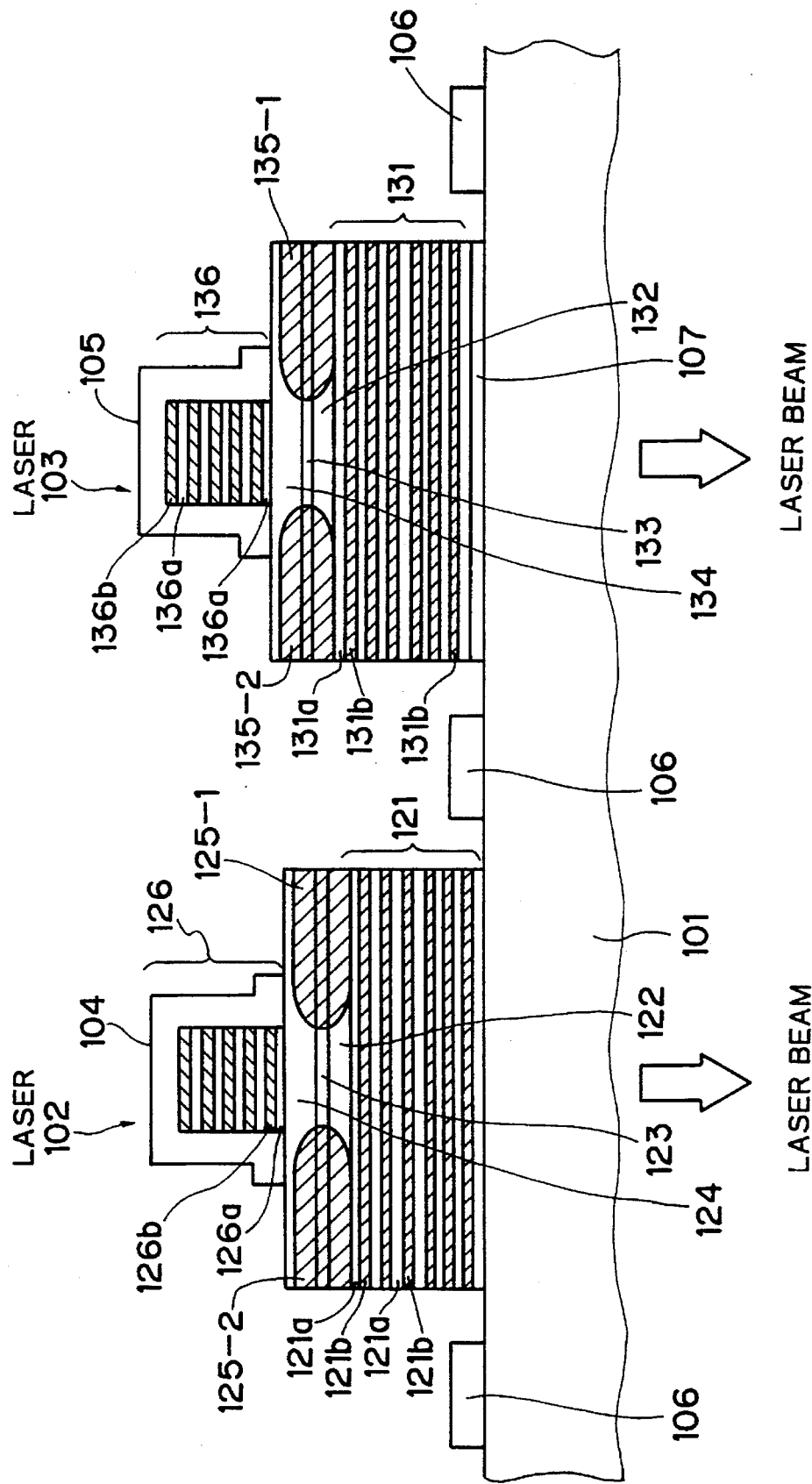
FIG. 4 is a detail sectional view, on a greatly enlarged scale, of the optoelectronic integrated circuit of FIG. 3.

FIG. 4 illustrates a greater detail construction of the optoelectronic integrated circuit of FIG. 3. An n-type DBR (Distributed Bragg Reflector) 121 is an n-type semiconductor multilayer film in which 18.5 pairs of an n-AlAs layer 121a of thickness 81.2 nm and an n-GaAs layer 121b of thickness 68.1 nm are alternately stacked. A p-type DBR 126 is a p-type semiconductor multilayer film in which 15 pairs of a p-AlAs layer 126a of thickness 81.2 nm and a p-GaAs layer 126b of thickness 68.1 nm are alternately stacked. A cladding layer 122 comprises an $n-Al_{0.25}Ga_{0.75}As$ layer of thickness 0.285 um. A cladding layer 124 comprises a $p-Al_{0.25}Ga_{0.75}As$ layer of thickness 0.57 um. An active layer 123 is sandwiched between the cladding layers 122 and 124, and comprises three quantum-well $In_{0.2}Ga_{0.8}As$ layers interposing two barrier layers therebetween, each quantum-well $In_{0.2}Ga_{0.8}As$ layer having a thickness of 10 nm. Further, high resistant regions 125-1 and 125-2 are formed by proton implantation.

Likewise, an n-type DBR 131 is an n-type semiconductor multilayer film in which 18.5 pairs of an n-AlAs layer 131a of thickness 82.9 nm and an n-GaAs layer 131b of thickness 69.5 nm are alternately stacked. A p-type DBR 136 is a p-type semiconductor multilayer film in which 15 pairs of a p-AlAs layer 136a of thickness 82.9 nm and a p-GaAs layer 136b of thickness 69.5 nm are alternately stacked. A cladding layer 132 comprises an $n-Al_{0.25}Ga_{0.75}As$ layer of thickness 0.29 um. A cladding layer 134 comprises a $p-Al_{0.25}Ga_{0.75}As$ layer of thickness 0.58 um. An active layer 133 is sandwiched between the cladding layers 132 and 134, and comprises three quantum-well $In_{0.23}Ga_{0.77}As$ layers interposing two barrier layers therebetween, each quantum-well $In_{0.23}Ga_{0.77}As$ layer having a thickness of 10 nm. Further, high resistant regions 135-1 and 135-2 are formed by proton implantation.

A method of forming an optoelectronic integrated circuit having a construction such as this will hereinafter be described with reference to FIGS. 5A through 5D.

Figure 5A:
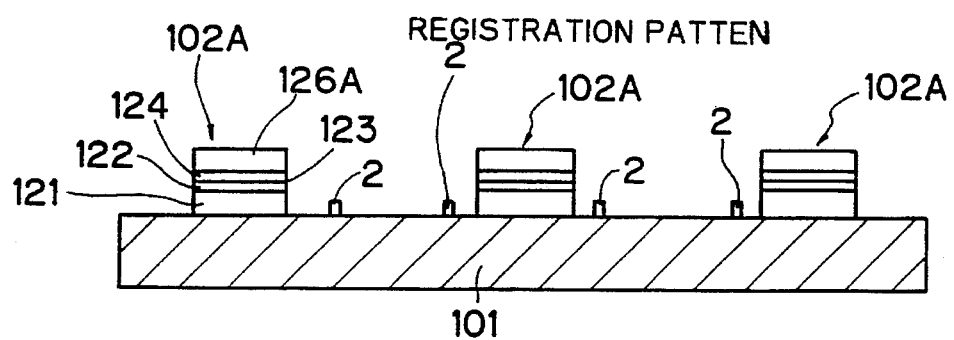
FIGS. 5A through 5D are diagrams the steps carried out by the second embodiment of FIG. 3.

First, as shown in FIG. 5A, the n-DBR layer 121, the cladding layer 122, the active layer 123, the cladding layer 124, and a p-DBR layer 126A are grown epitaxially upon the surface of the n-GaAs substrate 101, and mesa-shaped structures 102A of the order of 50 um×50 um are subsequently formed by a reactive-ion beam etching (RIBE) process using chlorine gas. Further, a plurality of registration patterns 2 are formed at predetermined positions near the structures 102A.

Figure 5B:
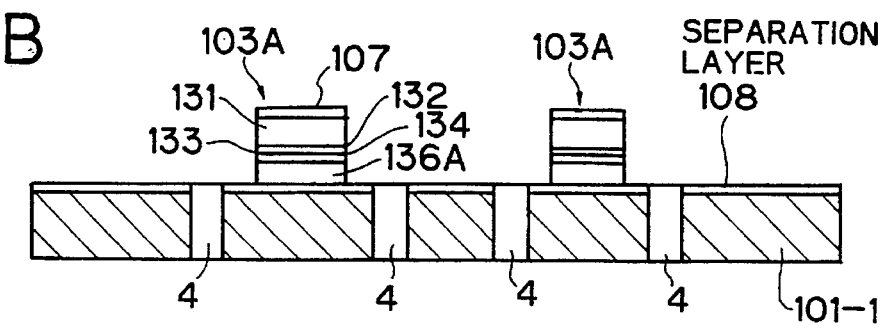

On the other hand, as shown in FIG. 5B, a plurality of through bores 4 have been formed in advance in a semi-insulating GaAs substrate 101-1 at positions corresponding to the registration patterns 2 by etching or a known cutting technique. A separation layer 108 comprising an $Al_{0.8}Ga_{0.2}As$ layer of thickness 0.5 um is grown epitaxially upon the surface of the semi-insulating GaAs substrate 101-1. The p-GaAs layer 136b and the p-AlAs layer 136a are alternately stacked to form a p-DBR layer 136A. Further, the cladding layer 134, the active layer 133, the cladding layer 132, and the n-DBR layer 131 are sequentially grown epitaxially. An InP layer 107 of thickness 5 to 10 nm is subsequently grown epitaxially upon the n-DBR layer 131, and mesa-shaped structures 103A of the order of 50 um×50 um are formed by the RIBE process using chlorine gas.

Figure 5C:
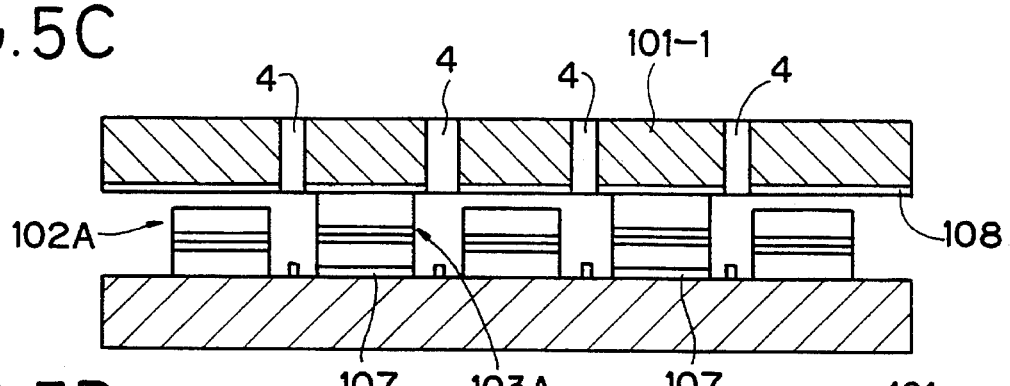

Next, after the first substrate 101 having the mesa-shaped structures 102A formed thereon has been lightly etched in an etchant of a sulfuric acid system, the second substrate 101-1 having the mesa-shaped structures 103A formed thereon is turned over as shown in FIG. 5C, and the InP layers 107 on the second substrate 101-1 are contacted with the surface of the first substrate 101 by referring to the registration patterns 2 through the through bores 4. In this state, they are annealed in an ambient of H2 at 700° C. for 90 min. In this way, the InP layers 107 and the first substrate (GaAs) 101 are bonded together. The registration patterns 2 can be viewed through the through bores 4, so registration becomes very easy.

Figure 5D:
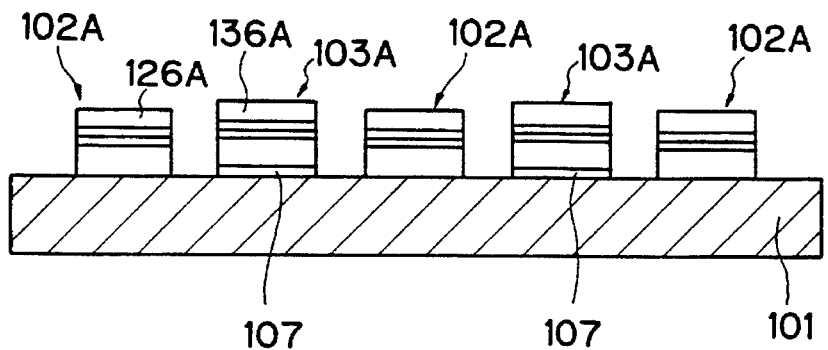

Subsequently, the substrates 101 and 101-1 in the bonded state are put in a etchant comprising a mixture of buffered hydrofluoric acid and 50% hydrofluoric acid. The etchant causes the separation layer 108 of $Al_{0.8}Ga_{0.2}As$ to be selectively etched. The buffered hydrofluoric acid goes into through the through bores 4, so the etching speed of the separation layer 108 becomes faster. In this way, the second substrate 101-1 is separated and the mesa-shaped structures 103A are transferred on the first substrate 101, as shown in FIG. 5D.

The n-DBRs 126A and 136A are subsequently patterned to the order of 10 um×10 um, as shown in FIG. 4, and 100 keV hydrogen ions are then implanted with a dose of $5×10^{14}$ $cm^{-2}$ to form high resistant regions 125-1, 125-2, and 125-3. After the main bodies of the surface emitting lasers 102A and 103A have been formed on the same substrate 101, electrodes 104, 105 and an electrode 106 are formed. In this way, two kinds of surface emitting lasers different in lasing wavelength can be formed on the same substrate 101, as shown in FIGS. 3 and 4.

In this embodiment, the epitaxial growth process, which has the largest influence on the characteristics of the surface emitting laser, is independently performed according to the kind of the laser, so the bonding process and the separation process will have little or no affect on the surface emitting laser.

It is noted that the n-type DBR 121 may be deposited after the InP layer of thickness 5 to 10 nm is grown epitaxially upon the surface of the n-GaAs substrate 101. In such case, there is no need to form the InP layer 107 of the second substrate 101-1. The point here is that the InP layer 107 as a bonding layer is formed on at least one of the surfaces of the first substrate 101 and the second mesa-shaped structure 103A.

While, in the above-described embodiment, surface emitting lasers of two kinds have been formed on the same substrate, devices of three or more kinds can be formed on the same substrate by repeating similar processes. More particularly, a second mesa-shaped structure, a third mesa-shaped structure, . . . are successively bonded through the bonding layer to the first substrate 101 on which the first mesa-shaped structure 102A was formed, and then the separation layer is removed. In such case, the height of the first mesa-shaped structure 102A is smallest, and a higher mesa-shaped structure is bonded in sequence. While in the above-described embodiment the separation layer 108 has not been etched, as shown in FIG. 5B, it is also possible to adjust a height by etching the separation layer 108 or the second substrate 101-1 just under the layer 108 except the portion just under the n-type DBR layer 136A of the second mesa-shaped structure 103A.

Generally, when a layer consisting of $Al_xGa_{1-x}As$ is etched in buffered hydrofluoric acid, the etching speed depends upon the composition ratio x. If the composition ratio x exceeds 0.35, the etching speed will be increased. It is therefore preferable that the separation layer 108 be $0.35<x<1$ and the cladding layers 122, 124, 132, and 134 be $0<x<0.35$. There are some cases where the largest composition ratio x is used as a cladding layer, depending upon a lasing wavelength. In such cases, the side surfaces of the first and second mesa-shaped structures 102A and 103A are protected with an Au-Ti alloy films, and the films are removed after the bonding and separation processes by making use of lithography. In addition, in the state shown in FIG. 5D in which the first and second mesa-shaped structures 102A and 103A have been formed on the first substrate 101, in order to passivate the periphery of the surface emitting layer, a high resistant layer such as undoped GaAs may be formed between the first and second mesa-shaped structures 102A and 103A and necessary patterning and electrode formation may be performed.

Figure 6:
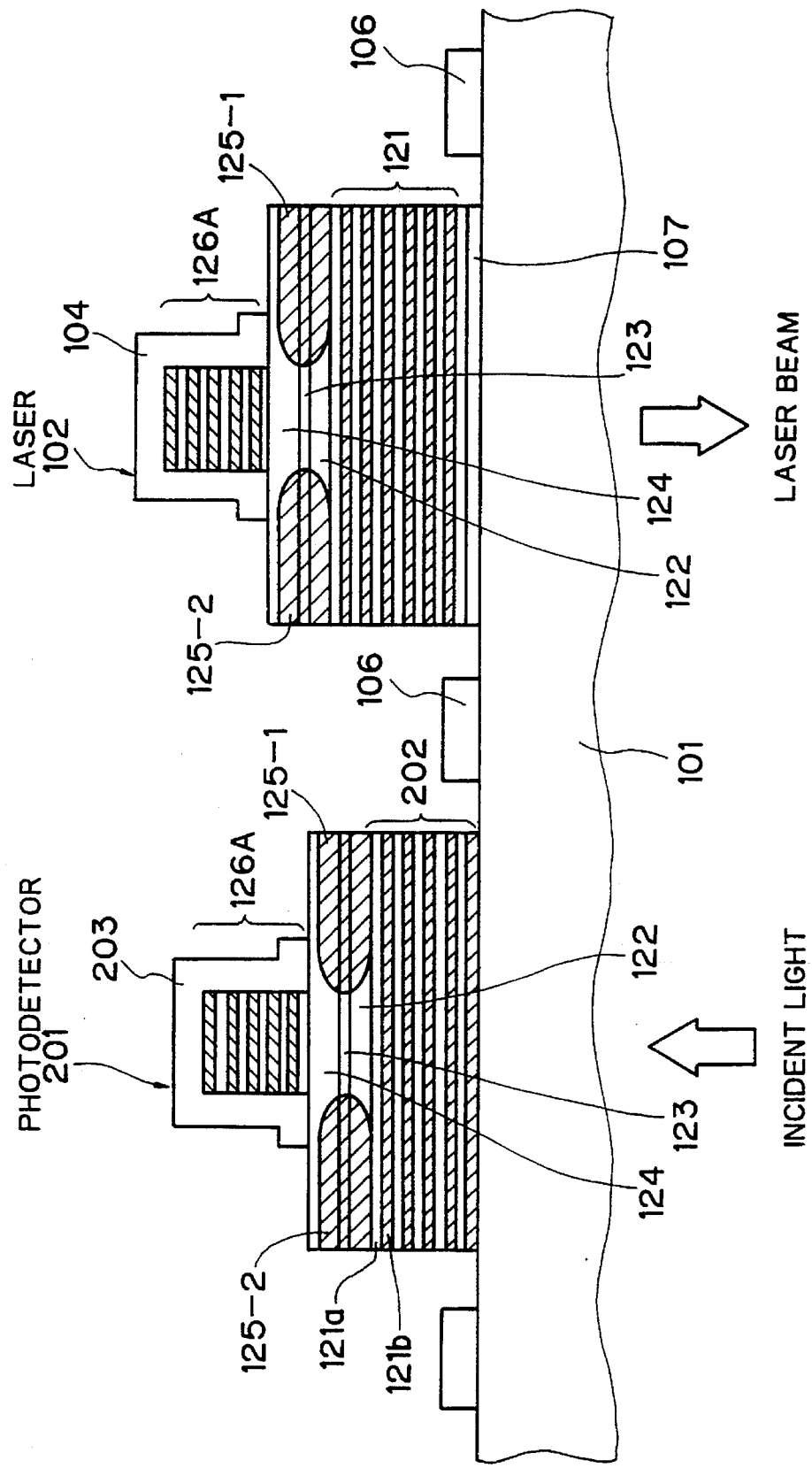
FIG. 6 is a detail sectional view showing another optoelectronic integrated circuit fabricated by the second embodiment of FIG. 3.

FIG. 6 schematically illustrates another example of an optoelectronic device fabricated according to the present invention where a light-receiving device (photodetector) 201 and a surface emitting laser 102 are made on the same substrate 101. The light-receiving device 201 is substantially identical in structure with the surface emitting laser 102 but different in that an n-DBR 202 consists of 10 pairs of an n-AlAs layer 121a and an n-GaAs layer 121b. If the electrode 106 is connected to ground and a negative voltage is applied to the electrode 203, the device 201 will function as a photodetector. The fabrication method of this optoelectronic device is substantially identical with that of the first example of FIG. 4 and therefore a description will not be given.

In the embodiment, the oscillating wavelength of the surface emitting laser 102 is equal to the receiving wavelength (wavelength with sensitivity) of the light-receiving device 201, but if the wavelengths are made different, a wavelength conversion (from the wavelength of the light-receiving device 201 to the wavelength of the surface emitting laser 102) can be performed by detecting the incident light of the receiving wavelength with a light-receiving device 201 and operating the surface emitting laser. If a negative AC voltage is applied to the electrode 104, the surface emitting laser 102 can also be operated as an optical modulator.

While in the above-described embodiments the surface optical devices have been formed on the same substrate, the present invention is not limited to this. For example, an electronic integrated circuit (logic IC comprising Field Effect Transistors) can be formed on the same substrate as the surface optical devices. In addition, while the surface emitting lasers 102 and 103 of vertical cavity type have been described by way of example, the concrete structure of the laser is not limited to this. Not only the laser but also any other surface emitting element can be used.

Further, although it has been described that the separation layer 108 comprises an $Al_xGa_{1-x}As$ layer, the layer may comprise any other suitable layer which can be grown epitaxially on a substrate and etched selectively. As described in the first embodiment of FIG. 1, the separation layer may comprise an $In_xAl_{1-x}As$ layer, provided phosphoric acid is used as an etchant. Likewise, the bonding layer is not limited to an InP film but may comprise any other suitable material which can be bonded and has no effect on the operation of devices.

Therefore, the present examples and embodiments are to be considered as illustrative and not restrictive and the invention is not to be limited to the details given herein, but may be modified within the scope of the appended claims.

What is claimed is:

1. A device fabrication method using direct-bonding, the method comprising the steps of:

preparing a first substrate on which at least one registration pattern is formed;

preparing a second substrate in which at least one through bore is formed corresponding to at least one registration pattern and on which at least one device is formed;

overlapping the first and second substrates by viewing at least one registration pattern through at least one through bore; and transferring at least one device from the second substrate to the first substrate.

2. The device fabrication method as set forth in claim 1, wherein at least one device is formed on the second substrate through a separation layer, and at least one device is transferred from the second substrate to the first substrate by selectively removing the separation layer by etching.

3. The device fabrication method as set forth in claim 1, wherein at least one other device has already been formed on the first substrate.

4. A device fabrication method using direct-bonding, the method comprising the steps of:

forming at least one registration pattern on a first substrate;

forming at least one through bore in a second substrate corresponding to at least one registration pattern;

forming at least one device on the second substrate through a separation layer;

overlapping the first and second substrates by viewing at least one registration pattern through at least one through bore, and bonding the first substrate and at least one device together; and separating at least one device from the second substrate by selectively etching the separation layer of the second substrate.

5. The device fabrication method as set forth in claim 4, wherein at least one other device has already been formed on the first substrate.

6. A device fabrication method using direct-bonding, the method comprising the steps of:

preparing a first substrate on which at least one first device and at least one registration pattern are formed;

preparing a second substrate on which at least one second device is formed through a separation layer and in which at least one through bore is formed corresponding to at least one registration pattern;

overlapping the first and second substrates by viewing at least one registration pattern through at least one through bore, and bonding the first substrate and at least one second device together; and separating at least one second device from the second substrate by selectively etching the separation layer of the second substrate.

7. The device fabrication method as set forth in claim 6, wherein the first device comprises a light-emitting device having a certain lasing wavelength and the second device comprises a light-emitting device different in lasing wavelength from the first device.

8. The device fabrication method as set forth in claim 7, wherein the first device comprises a light-emitting device having a certain lasing wavelength and the second device comprises a light-receiving device.

9. The device fabrication method as set forth in claim 8, wherein the first device comprises a light-emitting device having a certain lasing wavelength and the second device comprises a light-receiving device having a receiving wavelength different from the certain lasing wavelength.

\* \* \* \* \*